United States Patent
Chen et al.

(10) Patent No.: US 10,692,955 B2
(45) Date of Patent: Jun. 23, 2020

(54) AMOLED DISPLAY PANEL AND DISPLAY DEVICE

(71) Applicant: Wuhan China Star Optoelectronics Semiconductor Display Technology Co., Ltd., Wuhan, Hubei (CN)

(72) Inventors: Caiqin Chen, Hubei (CN); Dan Liu, Hubei (CN)

(73) Assignee: WUHAN CHINA STAR OPTOELECTRONICS SEMICONDUCTORS DISPLAY TECHNOLOGY CO., LTD., Wuhan (CN)

( * ) Notice: Subject to any disclaimer, the term of this patent is extended or adjusted under 35 U.S.C. 154(b) by 346 days.

(21) Appl. No.: 15/745,047

(22) PCT Filed: Nov. 30, 2017

(86) PCT No.: PCT/CN2017/114005
§ 371 (c)(1),
(2) Date: Jan. 15, 2018

(87) PCT Pub. No.: WO2019/100434
PCT Pub. Date: May 31, 2019

(65) Prior Publication Data
US 2019/0386086 A1 Dec. 19, 2019

(30) Foreign Application Priority Data
Nov. 24, 2017 (CN) .......................... 2017 1 1195576

(51) Int. Cl.
*H01L 27/32* (2006.01)

(52) U.S. Cl.
CPC ............................. *H01L 27/3276* (2013.01)

(58) Field of Classification Search
CPC ......................... H01L 27/3276; G09G 3/3225
See application file for complete search history.

(56) References Cited

U.S. PATENT DOCUMENTS

2006/0007078 A1* 1/2006 Lee ..................... G09G 3/3233
345/82
2009/0201235 A1 8/2009 Kane

FOREIGN PATENT DOCUMENTS

| CN | 202855739 U | 4/2013 |
| CN | 203085545 U | 7/2013 |

(Continued)

*Primary Examiner* — Jack S Chen
(74) *Attorney, Agent, or Firm* — Hemisphere Law, PLLC; Zhigang Ma

(57) ABSTRACT

An AMOLED display panel is provided. The AMOLED display panel includes a plurality of pixel structures arranged in a matrix and a plurality of power lines, configured to provide a driving power to the pixel structures, wherein two adjacent rows or two adjacent columns of the pixel structures is a period unit, each period unit is disposed corresponding to one of the power lines, the one of the power lines is disposed between the two adjacent rows or the two adjacent columns of the pixel structures, and the one of the power lines provides the driving power to the two adjacent rows or the two adjacent columns of the pixel structures disposed at two side of the one of the power lines. By practice of the disclosure, the amount of the power lines could be decreased, so high PPI (Pixels Per Inch) of the display panel could be achieved.

12 Claims, 2 Drawing Sheets

(56) References Cited

FOREIGN PATENT DOCUMENTS

| CN | 103268753 A | 8/2013 |
| CN | 103278984 A | 9/2013 |
| CN | 105047609 A | 11/2015 |

* cited by examiner

AMOLED DISPLAY PANEL AND DISPLAY DEVICE

RELATED APPLICATIONS

The present application is a National Phase of International Application Number PCT/CN2017/114005, filed Nov. 30, 2017, and claims the priority of China Application 201711195576.8, filed Nov. 24, 2017.

FIELD OF THE DISCLOSURE

The disclosure relates to a display technical field, and more particularly to a display device with an AMOLED display panel.

BACKGROUND

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

An AMOLED display panel includes a plurality of data lines and a plurality of scan lines crisscrossed to form a plurality of areas, wherein a plurality of pixel structures are disposed in the areas, and the pixel structures are arranged in a matrix. A typical AMOLED pixel structure is a 2T1C structure, including two thin film transistors (2T, T represents transistor), a storage capacitor (1C, C represents capacitor) and an OLED (organic light emitting diode). Wherein a transistor is used for a switch transistor, configured to control the data line to charge the storage capacitor, another transistor is used for a driving transistor, configured to receive the driving power to provide the driving current to the OLED, and the storage capacitor is configured to keep the driving voltage applied on the gate of the driving transistor in the emission period of the OLED. Wherein the AMOLED display panel further includes a plurality of power lines in order to provide the driving power to the pixel structures. Generally, a power line is disposed corresponding to a column of the pixel structures, all of the pixel structures in the same column of the pixel structures is connected to the same power line to obtain the driving power.

The resolution is as an important parameter of evaluating the quality of an AMOLED display panel, the resolution is directly related to the size of the pixel structure and the wiring layout of the signal lines (data lines, scan lines, power lines, etc.), so the high PPI (Pixels Per Inch, the pixel number of per inch) AMOLED display panel is an important goal in the industry.

SUMMARY

A technical problem to be solved by the disclosure is to provide an AMOLED display panel to improve the layout of the power lines, so the PPI of the AMOLED display panel could be increased.

To achieve the above object, according to one aspect, the embodiment of the disclosure provides an AMOLED display panel, including:

a plurality of pixel structures, arranged in a matrix; and
a plurality of power lines, configured to provide a driving power to the pixel structures;

wherein two adjacent rows or two adjacent columns of the pixel structures is a period unit, each period unit is disposed corresponding to one of the power lines, the one of the power lines is disposed between the two adjacent rows or the two adjacent columns of the pixel structures, and the one of the power lines provides the driving power to the two adjacent rows or the two adjacent columns of the pixel structures disposed at two side of the one of the power lines.

In an embodiment, a width of the power line ranges from 2.5 μm to 5 μm.

In an embodiment, a distance between the power line and a signal line adjacent to the power line ranges from 3 μm to 4 μm.

In an embodiment, the AMOLED display panel further includes a plurality of data lines and a plurality of scan lines crisscrossed to form a plurality of areas, wherein the pixel structures are disposed in the areas.

In an embodiment, the power lines are parallel to the data lines and perpendicular to the scan lines, and the one of the power lines is disposed between the two adjacent columns of the pixel structures.

In an embodiment, the AMOLED display panel further includes a first main power line and a second main power line disposed outside the pixel structures, wherein the first main power line and the second main power line respectively extend along a direction perpendicular to the data lines, an end of the power lines is connected to the first main power line, and another end of the power lines is connected to the second main power line.

In an embodiment, the power lines are parallel to the scan lines and perpendicular to the data lines, and the one of the power lines is disposed between the two adjacent rows of the pixel structures.

In an embodiment, the AMOLED display panel further includes a first main power line and a second main power line disposed outside the pixel structures, wherein the first main power line and the second main power line respectively extend along a direction perpendicular to the scan lines, an end of the power lines is connected to the first main power line, and another end of the power lines is connected to the second main power line.

In an embodiment, one of the pixel structures comprises an organic light emitting diode, a storage capacitor and a plurality of thin film transistors.

According to another aspect, the embodiment of the disclosure provides a liquid crystal display device including an above-mentioned backlight module.

The embodiment of the disclosure provides a display device, including a driving unit and an above-mentioned AMOLED display panel. The driving unit provides a driving signal to the AMOLED display panel and the AMOLED display panel displays an image.

The AMOLED display panel provided by the embodiments of the disclosure improves the layout of the power lines and reduces the amount of the power lines, so the space occupied by the power lines is decreased and the PPI of the AMOLED display panel could be increased.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
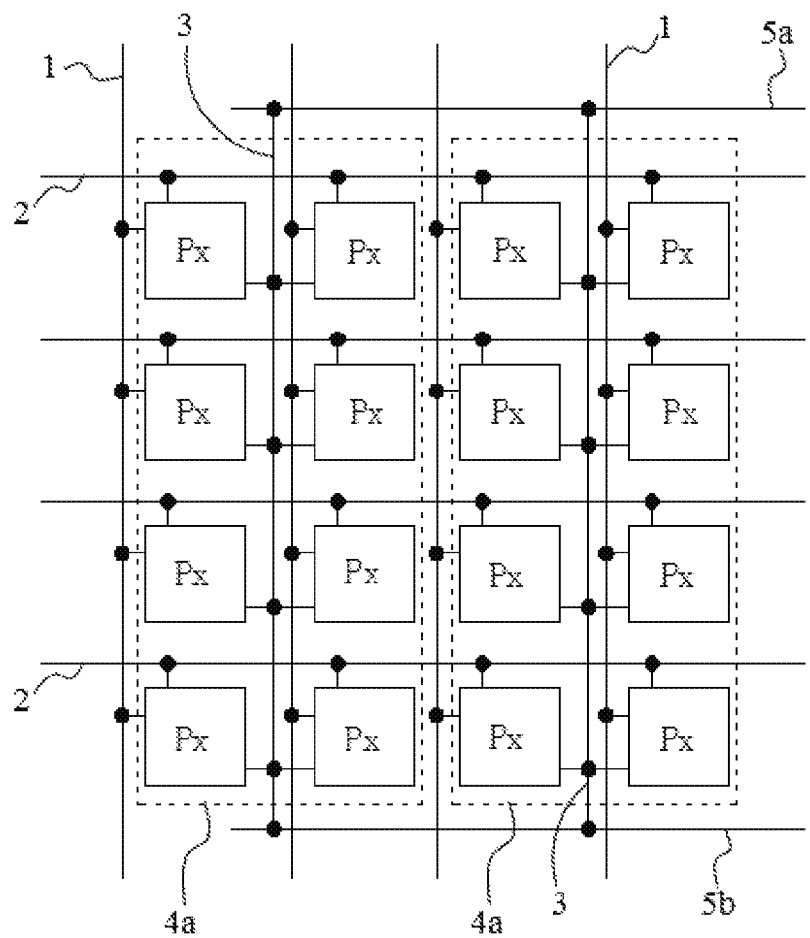
FIG. 1 is a structural schematic view of an AMOLED display panel according to Embodiment 1 of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Embodiment 1

Referring to FIG. 1, an AMOLED display panel provided by the embodiment includes a plurality of data lines 1, a plurality of scan lines 2, a plurality of power lines 3, and a plurality of pixel structures Px. The data lines 1 and the scan lines 2 are crisscrossed to form a plurality of areas, wherein the pixel structures Px are disposed in the areas. The pixel structures Px are arranged in a matrix (there are few pixel structures Px in FIG. 1 just for example), and the pixel structure Px are respectively electrically connected to the data lines 1, the scan lines 2, and the power lines 3.

Figure 2:
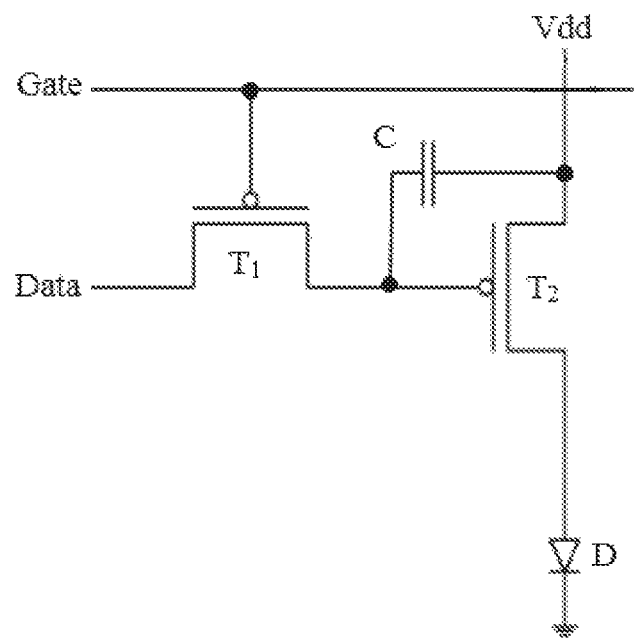
FIG. 2 is a structural schematic view of a pixel structure according to an embodiment of the disclosure.

Referring to FIG. 2, a typical AMOLED pixel structure in the AMOLED display panel is a 2T1C structure, including two thin film transistors T1, T2, a storage capacitor C and an organic light emitting diode D. Wherein the transistor T1 is used for a switch transistor, controlled by a scan signal Gate and configured to control a data signal Data to charge the storage capacitor C, the transistor T2 is used for a driving transistor, configured to receive a driving power Vdd to provide the driving current to the organic light emitting diode D, and the storage capacitor C is configured to keep the driving voltage applied on the gate of the driving transistor in the emission period of the organic light emitting diode D. Wherein for each pixel structure Px, the data signal is provided by one of the data lines 1, the scan signal Gate is provided by one of the scan lines 2, and the driving power Vdd is provided by one of the power lines.

It should be noted that the above-mentioned pixel structure Px is just for an example. The low temperature polysilicon technology is usually applied on manufacturing the pixel structure in AMOLED display panel, since the uniformity of the threshold voltages of the TFTs is poor and drifts, the driving current of the organic light emitting diode D is not uniform and the light emission is unstable. In order to solve the problem that the driving current of the organic light emitting diode D is not uniform, the existing technical solution is increasing the number of thin film transistors and storage capacitors in the pixel structure Px to improve the electrical uniformity. That is an mT+nC structure, for example, six thin film transistors and one storage capacitors to form the 6T1C pixel structure Px, six thin film transistors and two storage capacitors to form the 6T2C pixel structure Px, or seven thin film transistors and one storage capacitors to form the 7T1C pixel structure Px.

In this embodiment, as shown in FIG. 1, in the AMOLED display panel, two adjacent columns of the pixel structures Px is a period unit 4a, each period unit 4a is disposed corresponding to one of the power lines 3, the one of the power lines 3 is disposed between the two adjacent columns of the pixel structures Px, and the one of the power lines 3 provides the driving power Vdd to the two adjacent columns of the pixel structures Px disposed at two side of the one of the power lines 3. Specifically, the power lines 3 are parallel to the data lines 2 and perpendicular to the scan lines 2, and the one of the power lines 3 is disposed between the two adjacent columns of the pixel structures Px. All of the pixel structures Px in the two adjacent columns of the pixel structures Px is connected to the one of the power lines 3.

Furthermore, as shown in FIG. 1, the AMOLED display panel further includes a first main power line 5a and a second main power line 5b disposed outside the pixel structures Px, wherein the first main power line 5a and the second main power line 5b respectively extend along a direction perpendicular to the data lines 1, an end of the power lines 3 is connected to the first main power line 5a, and another end of the power lines is connected to the second main power line 5b.

In this embodiment, wherein a width of the power line 3 ranges about from 2.5 μm to 5 μm, a distance between the power line 3 and a signal line (the data line 1 in this embodiment) adjacent to the power line 3 ranges about from 3 μm to 4 μm.

Two adjacent columns of the pixel structures connected to and using the same power line in the AMOLED display panel provided by the above-mentioned embodiment compares to a column or a row of the pixel structures connected to and using a power line, that improves the layout of the power lines and reduces the amount of the power lines, the space occupied by the power lines is decreased and the display panel with the same area could dispose more pixel structures, so the PPI of the AMOLED display panel could be increased.

Embodiment 2

Figure 3:
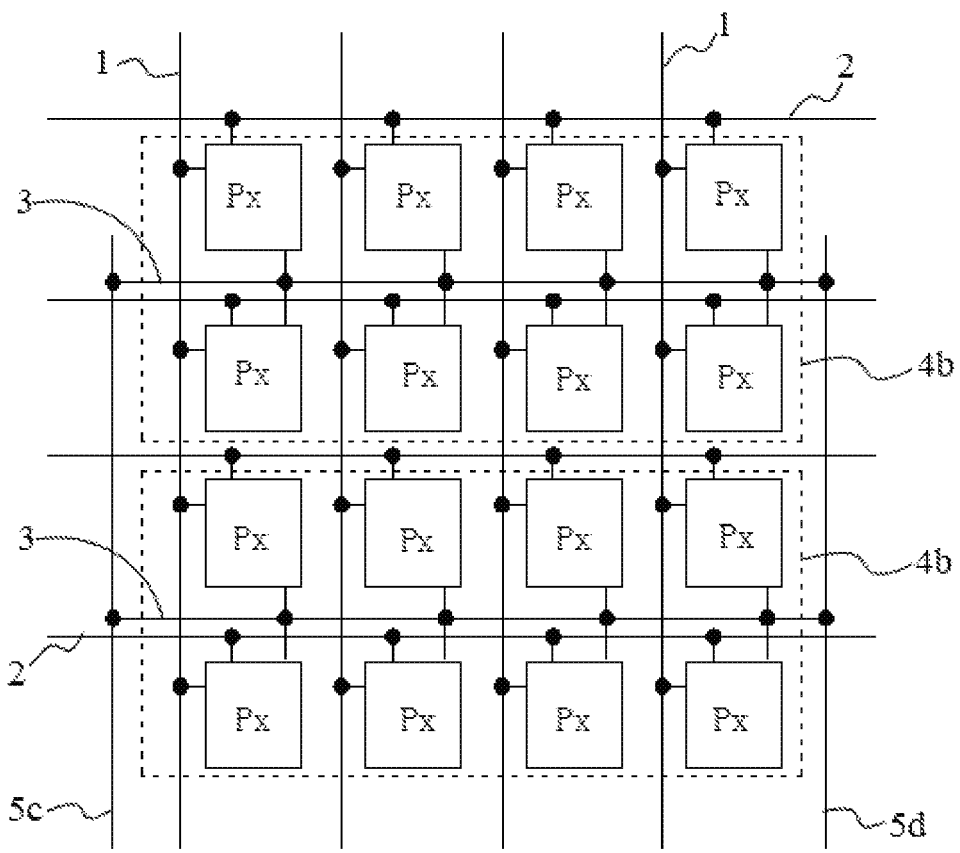
FIG. 3 is a structural schematic view of an AMOLED display panel according to Embodiment 2 of the disclosure.

The difference between this embodiment and Embodiment 1 is: as shown in FIG. 3, in the AMOLED display panel, two adjacent rows of the pixel structures Px is a period unit 4b, each period unit 4b is disposed corresponding to one of the power lines 3, the one of the power lines 3 is disposed between the two adjacent rows of the pixel structures Px, and the one of the power lines 3 provides the driving power Vdd to the two adjacent rows of the pixel structures Px disposed at two side of the one of the power lines 3. Specifically, the power lines 3 are parallel to the scan lines 2 and perpendicular to the data lines 1, and the one of the power lines 3 is disposed between the two adjacent rows of the pixel structures Px. All of the pixel structures Px in the two adjacent rows of the pixel structures Px is connected to the one of the power lines 3. Furthermore, as shown in FIG. 3, the AMOLED display panel further includes a first main power line 5c and a second main power line 5d disposed outside the pixel structures Px, wherein the first main power line 5c and the second main power line 5d respectively extend along a direction perpendicular to the scan lines 2, an end of the power lines 3 is connected to the first main power line 5c, and another end of the power lines 3 is connected to the second main power line 5d.

The other structures of the AMOLED display panel in this embodiment are same with Embodiment 1, so the details not addressed herein. Two adjacent rows of the pixel structures connected to and using the same power line in the AMOLED display panel provided by the above-mentioned embodiment compares to a column or a row of the pixel structures connected to and using a power line, that improves the layout of the power lines and reduces the amount of the power lines, the space occupied by the power lines is decreased and the display panel with the same area could dispose more pixel structures, so the PPI of the AMOLED display panel could be increased.

Embodiment 3

Figure 4:
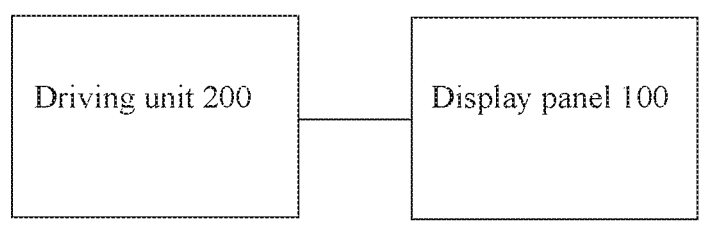
FIG. 4 is a structural schematic view of a display device according to Embodiment 3 of the disclosure.

A display device is provided by this embodiment, as shown in FIG. 4. The display device includes a driving unit 200 and an AMOLED display panel 100. The driving unit 200 provides a driving signal to the AMOLED display panel 100 and the AMOLED display panel 100 displays an image. The AMOLED display panel 100 is the AMOLED display panel of Embodiment 1 or Embodiment 2. Wherein the driving signal includes a data signal Data, a scan signal Gate, and a driving power Vdd, etc.

In summary, the AMOLED display panel and the display device provided by the embodiments of the disclosure could improve the layout of the power lines, the two adjacent rows or two adjacent columns could use the same power line, so the PPI of the AMOLED display panel could be increased.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An AMOLED display panel, comprising:
a plurality of pixel structures, arranged in a matrix;
a plurality of power lines, configured to provide a driving power to the pixel structures;
a plurality of data lines and a plurality of scan lines crisscrossed to form a plurality of areas;
a first main power line; and
a second main power line,
wherein two adjacent rows or two adjacent columns of the pixel structures is a period unit, each period unit is disposed corresponding to one of the power lines, the one of the power lines is disposed between the two adjacent rows or the two adjacent columns of the pixel structures, and the one of the power lines provides the driving power to the two adjacent rows or the two adjacent columns of the pixel structures disposed at two side of the one of the power lines, the pixel structures are disposed in the areas, the power lines are parallel to the data lines and perpendicular to the scan lines, and the one of the power lines is disposed between the two adjacent columns of the pixel structures, the first main power line and the second main power line are disposed outside the pixel structures, wherein the first main power line and the second main power line respectively extend along a direction perpendicular to the data lines, an end of the power lines is connected to the first main power line, and another end of the power lines is connected to the second main power line.

2. The AMOLED display panel according to claim 1, wherein a width of the power line ranges from 2.5 μm to 5 μm.

3. The AMOLED display panel according to claim 2, wherein a distance between the power line and a signal line adjacent to the power line ranges from 3 μm to 4 μm.

4. The AMOLED display panel according to claim 1, wherein one of the pixel structures comprises an organic light emitting diode, a storage capacitor and a plurality of thin film transistors.

5. An AMOLED display panel, comprising:
a plurality of pixel structures, arranged in a matrix;
a plurality of power lines, configured to provide a driving power to the pixel structures;
a plurality of data lines and a plurality of scan lines crisscrossed to form a plurality of areas;
a first main power line; and
a second main power line,
wherein two adjacent rows or two adjacent columns of the pixel structures is a period unit, each period unit is disposed corresponding to one of the power lines, the one of the power lines is disposed between the two adjacent rows or the two adjacent columns of the pixel structures, and the one of the power lines provides the driving power to the two adjacent rows or the two adjacent columns of the pixel structures disposed at two side of the one of the power lines, the pixel structures are disposed in the areas, the power lines are parallel to the scan lines and perpendicular to the data lines, and the one of the power lines is disposed between the two adjacent rows of the pixel structures, the first main power line and the second main power line are disposed outside the pixel structures, wherein the first main power line and the second main power line respectively extend along a direction perpendicular to the scan lines, an end of the power lines is connected to the first main power line, and another end of the power lines is connected to the second main power line.

6. The AMOLED display panel according to claim 5, wherein one of the pixel structures comprises an organic light emitting diode, a storage capacitor and a plurality of thin film transistors.

7. The AMOLED display panel according to claim 5, wherein a width of the power line ranges from 2.5 μm to 5 μm.

8. The AMOLED display panel according to claim 7, wherein a distance between the power line and a signal line adjacent to the power line ranges from 3 μm to 4 μm.

9. A display device, comprising:
an AMOLED display panel; and
a driving unit, configured to provide a driving signal to the AMOLED display panel;
wherein the AMOLED display panel comprises:
  a plurality of pixel structures, arranged in a matrix;
  a plurality of power lines, configured to provide a driving power to the pixel structures;
  a plurality of data lines and a plurality of scan lines crisscrossed to form a plurality of areas;
  a first main power line; and
  a second main power line;
  wherein two adjacent rows or two adjacent columns of the pixel structures is a period unit, each period unit is disposed corresponding to one of the power lines, the one of the power lines is disposed between the two adjacent rows or the two adjacent columns of the pixel structures, the one of the power lines provides the driving power to the two adjacent rows or the two adjacent columns of the pixel structures disposed at two side of the one of the power lines, the pixel structures are disposed in the areas, the first main power line and the second main power line are disposed outside the pixel structures, an end of the power lines is connected to the first main power line, and another end of the power lines is connected to the second main power line;
  wherein, the power lines are parallel to the data lines and perpendicular to the scan lines, the one of the power lines is disposed between the two adjacent columns of the pixel structures, and the first main power line and the second main power line respectively extend along a direction perpendicular to the data lines; or the power lines are parallel to the scan lines and perpendicular to the data lines, the one of the power lines is disposed between the two adjacent rows of the pixel structures, and the first main power line and the second main power line respectively extend along a direction perpendicular to the scan lines.

10. The display device according to claim 9, wherein a width of the power line ranges from 2.5 μm to 5 μm.

11. The display device according to claim 10, wherein a distance between the power line and a signal line adjacent to the power line ranges from 3 μm to 4 μm.

12. The display device according to claim 9, wherein one of the pixel structures comprises an organic light emitting diode, a storage capacitor and a plurality of thin film transistors.

* * * * *